(12) United States Patent
Pollard et al.

(10) Patent No.: US 8,835,290 B2
(45) Date of Patent: Sep. 16, 2014

(54) METHODS AND COMPOSITIONS FOR DOPING SILICON SUBSTRATES WITH MOLECULAR MONOLAYERS

(71) Applicant: Dynaloy, LLC, Kingsport, TN (US)

(72) Inventors: Kimberly Dona Pollard, Anderson, IN (US); Allison C. Tonk, Carmel, IN (US)

(73) Assignee: Dynaloy, LLC, Kingsport, TN (US)

( * ) Notice: Subject to any disclaimer, the term of this patent is extended or adjusted under 35 U.S.C. 154(b) by 0 days.

(21) Appl. No.: 13/875,566

(22) Filed: May 2, 2013

(65) Prior Publication Data

US 2013/0260545 A1    Oct. 3, 2013

Related U.S. Application Data

(63) Continuation of application No. 13/645,539, filed on Oct. 5, 2012, now Pat. No. 8,466,035, which is a continuation of application No. 13/042,541, filed on Mar. 8, 2011.

(60) Provisional application No. 61/311,516, filed on Mar. 8, 2010.

(51) Int. Cl.
*H01L 21/228* (2006.01)
*H01L 21/225* (2006.01)
*H01L 21/22* (2006.01)

(52) U.S. Cl.
CPC .......... *H01L 21/228* (2013.01); *H01L 21/2254* (2013.01); *H01L 21/2225* (2013.01)
USPC ..... 438/542; 438/302; 438/452; 257/E21.135

(58) Field of Classification Search
USPC .................. 438/302, 452, 542; 257/E21.135
See application file for complete search history.

(56) References Cited

U.S. PATENT DOCUMENTS

| | | | |
|---|---|---|---|
| 4,490,192 A | 12/1984 | Gupta et al. | |
| 5,665,845 A * | 9/1997 | Allman | ............................ 528/8 |
| 6,323,137 B1 | 11/2001 | Ku et al. | |
| 6,695,903 B1 | 2/2004 | Kübelbeck et al. | |
| 6,911,293 B2 | 6/2005 | Wanat et al. | |

(Continued)

FOREIGN PATENT DOCUMENTS

| | | |
|---|---|---|
| JP | 2005 123431 A | 5/2005 |
| WO | WO 01/14250 A2 | 3/2001 |
| WO | WO 2011/112546 A1 | 9/2011 |

OTHER PUBLICATIONS

Ho, Johnny C., et al.; "Controlled Nanoscale Doping of Semiconductors via Molecular Monolayers"; Nature Materials, vol. 7, Issue 1, pp. 62-67 (2008); published online Nov. 11, 2007.

(Continued)

*Primary Examiner* — Charles Garber
*Assistant Examiner* — Stanetta Isaac
(74) *Attorney, Agent, or Firm* — Dennis V. Carmen

(57) ABSTRACT

Compositions and methods for doping silicon substrates by treating the substrate with a diluted dopant solution comprising tetraethylene glycol dimethyl ether (tetraglyme) and a dopant-containing material and subsequently diffusing the dopant into the surface by rapid thermal annealing. Diethyl-1-propylphosphonate and allylboronic acid pinacol ester are preferred dopant-containing materials, and are preferably included in the diluted dopant solution in an amount ranging from about 1% to about 20%, with a dopant amount of 4% or less being more preferred.

22 Claims, 2 Drawing Sheets

(56) References Cited

U.S. PATENT DOCUMENTS

| | | | |
|---|---|---|---|
| 7,064,087 | B1 | 6/2006 | Turner et al. |
| 8,097,305 | B2 | 1/2012 | Meyer et al. |
| 8,268,883 | B2 | 9/2012 | Hogg et al. |
| 8,466,035 | B2 | 6/2013 | Pollard et al. |
| 8,748,301 | B2 | 6/2014 | Morita et al. |
| 2006/0099831 | A1 | 5/2006 | Borovik et al. |
| 2008/0122005 | A1 | 5/2008 | Horsky et al. |
| 2009/0286349 | A1* | 11/2009 | Rohatgi et al. ............ 438/98 |
| 2011/0081742 | A1 | 4/2011 | Barr et al. |
| 2011/0124187 | A1 | 5/2011 | Afzali-Ardakani et al. |
| 2011/0186969 | A1* | 8/2011 | Afzali-Ardakani et al. .. 257/632 |
| 2012/0003826 | A1 | 1/2012 | Pollard et al. |
| 2012/0160306 | A1 | 6/2012 | Hirai et al. |
| 2014/0124896 | A1 | 5/2014 | Hochstetler et al. |

OTHER PUBLICATIONS

Ho, Johnny C., et al.; "Controlled Nanoscale Doping of Semiconductors via Molecular Monolayers"; Supporting Information; Nature Materials, vol. 7, issue 1, (2007), 10 pages.

Ho, Johnny C., et al.; "Wafer-Scale, Sub-5 nm Junction Formation by Monolayer Doping and Conventional Spike Annealing"; Nano Letters 9 (2), pp. 725-730, (2009); published online Jan. 22, 2009.

Sieval, Alexander B., et al.; An Improved Method for the Preparation of Organic Monolayers of 1-Alkenes on Hydrogen-Terminated Silicon Surfaces; Langmuir 1999, vol. 15, pp. 8288-8291.

Leftwich, Timothy R., et al.; "Chemical manipulation of multifunctional hydrocarbons on silicon surfaces"; Surface Science Reports 63, (2008), pp. 1-71.

Tapia-Benavides, Antonio R., et al.; "Do Spiroarsoranes Exhibit Polytopal Equilibrium in Solution?", Inorg. Chem. 2010, 49, pp. 1496-1502.

Dale, Arild J., et al.; "The Preparation and Dynamic Stereochemistry of Oxyarsoranes Containing Five- and Six-membered Ring Systems", Acta Chemica Scandinavica B 29, (1975), pp. 741-748.

Loiseau, P.M., et al.; "Design, Synthesis and Biological Study of New Antiparasitic Spiroarsoranes"; Arzneim.-Forsch./ Drug Res. 43 (II), Nr. 9, (1993), pp. 1004-1009.

Betz, Richard, et al.; "From Simple Diols to Carbohydrate Derivatives of Phenylarsonic Acid"; Inorganic Chemistry 2009, 48, pp. 925-935.

International Search Report with an International filed Mar. 8, 2011, International Application No. PCT/US 11/27493.

Co-pending U.S. Appl. 13/669,087, filed Nov. 5, 2012.

USPTO Office Action dated Jul. 8, 2013 in co-pending U.S. Appl. No. 13/042,541.

USPTO Notice of Allowance dated Feb. 14, 2012 in co-pending U.S. Appl. No. 13/042,541.

USPTO Notice of Allowance dated Mar. 27, 2014 in co-pending U.S. Appl. No. 13/042,541.

International Search Report and Written Opinion with date of mailing Apr. 24, 2014 for International Application No. PCT/US2013/068426.

Co-pending U.S. Appl. No. 14/272,482, filed May 7, 2014, Monika Karin Wiedmann et al.

Ho, Johnny C., et al.; "Nanoscale doping of InAs via sulfur monolayers"; Applied Physics Letters, 95, 072108 (2009).

Sieval, A.B., et al.; "Highly Stable Si-C Linked Functionalized Monolayers on the Silicon (100) Surface"; Langmuir, 1998, 14, 1759-1768.

Scheres, Luc, et al.; "Organic Monolayers onto Oxide-Free Silicon and Improved Surface Coverage: Alkynes versus Alkenes"; Langmuir, 2010, 26(7), 4790-4795.

Boukherroub, Rabah, et al.; Insights into the Formation Mechanisms of Si-OR Monolayers from the Thermal Reactions of Alcohols and Aldehydes with Si(111)-H[1]; Langmuir, 2000, 16, 7429-7434.

Sauer, D.E., et al.; "Ultrahigh vacuum surface analysis of silicon (100) treated in aqueous hydrofluoric acid and buffered hydrofluoric acid solutions"; Applied Surface Science, 78, (1994), 47-55.

Lafranzo, Natalie A., et al.; "Arsonic Acid Self-Assembled Monolayers Protect Oxide Surfaces from Micronewton Nanomechanical Forces"; Adv. Funct. Mater., 2013, 23, 2415-2421.

Becker, Frank S., et al.; "Low Pressure Deposition of Doped $SiO_2$ by Pyrolysis of Tetraethylorthosilicate (TEOS) II. Arsenic Doped Film"; J. Electrochem. Soc., vol. 136, No. 10, Oct. 1989, 3033-3043.

Baer, Carl D., et al.; "Kinetics of the Hydrolysis of Arsenate(V) Triesters"; Inorg. Chem., 1981, 20, 905-907.

Kuhn, B., et al.; "Versuche zur quantitativen Bestimmung des Arsens nach dem Marsh'schen Verfahreh. Verhalten des Arsenwasserstoffes zu Aktzkali"; Berichte der Deutchen Chemischen Gesellschaft, 23, 1798-1803.

Musil, Stanislav, et al.; "Speciation without Chromatography using Selective Hydride Generation: Inorganic Arsenic in Rice and Samples of Marine Origin"; Analytical Chemistry, 2014, 86, 993-999.

Longo, Robert C., et al.; "Monolayer Doping via Phosphonic Acid Grafting on Silicon: Microscopic Insight from Infrared Spectroscopy and Density Functional Theory Calculations"; Adv. Funct. Mater., 2013, 23, 3471-3477.

Thissen, Peter, et al.; "Activation of Surface Hydroxyl Groups by Modification of H-Terminated Si(111) Surfaces"; J. Am. Chem. Soc., 2012, 134, 8869-8874.

USPTO Notice of Allowance dated Jul. 8, 2014 in co-pending U.S. Appl. No. 13/042,541.

Voorthuijzen, W. Pim, et al.; "Local Doping of Silicon Using Nanoimprint Lithography and Molecular Monolayers"; Advanced Materials, 2011, 23, 1346-1350.

USPTO Notice of Allowance dated Jul. 14, 2014 in co-pending U.S. Appl. No. 13/669,087.

* cited by examiner

METHODS AND COMPOSITIONS FOR DOPING SILICON SUBSTRATES WITH MOLECULAR MONOLAYERS

CROSS REFERENCE TO RELATED APPLICATIONS

This application is a continuation application of U.S. patent application Ser. No. 13/645,539, filed Oct. 5, 2012, which is a continuation application of U.S. patent application Ser. No. 13/042,541 filed Mar. 8, 2011, and claims the priority benefit of the provisional application U.S. Ser. No. 61/311,516 filed Mar. 8, 2010, each of which are hereby incorporated herein by reference.

FIELD OF THE INVENTION

The present invention relates generally to methods for doping a Si surface, and more particularly to methods for doping a Si surface by treating the substrate with a dopant solution and subsequently diffusing the dopant into the surface by rapid thermal annealing.

BACKGROUND OF THE INVENTION

Decreasing device size has been the main driving force for technology advancements in the semiconductor industry over the last several decades. For example, in front end of line (FEOL) applications in semiconductor processing, junction depths have been scaled continuously together with the gate lengths in order to achieve faster transistor speeds and higher packing densities. Typically, source/drain extension junction depths of about one third of the transistor gate length have been used for efficient electrostatics and acceptable leakage currents. With gate lengths fast approaching the sub-10 nm regimes, development work is focused on reliably making sub-5 nm ultrashallow junctions (USJs) with low sheet resistivity to facilitate the future scaling of transistors.

Most commonly, USJs are commercially fabricated by the combination of ion implantation and spike annealing. During the process, Si atoms are displaced by energetic dopant ions and a subsequent annealing step (e.g. spike, a high temperature anneal process of less than 1 s with fast temperature ramp up/down capability) is used to activate the dopants by moving them into the appropriate lattice positions and restoring the substrate's crystal quality. Unfortunately, point defects such as Si interstitials and vacancies are also generated, which interact with the dopants to further broaden the junction profile—called transient-enhanced diffusion (TED), which limits the formation for sub-10 nm USJs by conventional technologies.

Significant research efforts have been made to develop new strategies to manufacture <5 nm USJs which utilize heavier implantation dopant sources (molecular implantation, gas cluster ion beam, and plasma doping) to obtain shallower doping profiles, and advanced annealing techniques (flash and laser) to activate the implanted dopants without causing significant diffusion. However, problems relating to the effects of advanced doping and annealing techniques on junction uniformity, reliability and subsequent process integration continue to hamper their use in IC manufacturing.

One potential route for achieving the USJs, while maintaining controlled doping of semiconductor materials with atomic accuracy, at such small scales, takes advantage of the crystalline nature of silicon and its rich, self-limiting surface reaction properties. This method relies on the formation of self-assembled monolayers of dopant-containing molecules on the surface of crystalline Si followed by the subsequent thermal diffusion of dopant atoms via rapid thermal annealing (RTA).

Ground-breaking work in this area has been performed by Professor Ali Javey at Berkeley (Nature Materials, vol. 7, January 2008, pp 62-67; Nanoletters, 2009 Vol. 9, No 2, pp 725-730). Dr. Javey and his group successfully doped silicon wafers by treating the Si surfaces with a dopant dissolved in mesitylene (the dopant being allylboronic acid pinacol ester for p-doped wafers, and diethyl-1-propylphosphonate for n-doped wafers), and subsequently annealing the material to diffuse the dopant atoms into the surface and achieve the n+/p USJs. Dr. Javey's results were confirmed by SIMS, and penetration depth for P-containing mixtures were observed to be ~3-3.5 nm.

Problems remain to be solved with the Javey process though. For example, the mesitylene-containing treatment solutions used by Dr. Javey are not appropriate for commercial applications where high surface modification reaction temperatures are employed and commercial-scale material handling considerations are important. Accordingly, a need remains for improvements to Dr. Javey's method for doping silicon substrates. The present invention addresses that need.

SUMMARY OF THE INVENTION

In one preferred embodiment of the present invention there is provided a method for doping a Si surface comprising treating the substrate with a diluted dopant solution comprising tetraethylene glycol dimethyl ether (tetraglyme) and a dopant-containing material and subsequently diffusing the dopant into the surface. Dithyl-1-propylphosphonate and allylboronic acid pinacol ester are preferred dopant-containing materials, and are preferably included in the diluted dopant solution in an amount ranging from about 1% to about 20%, with a dopant amount of 4% or less being more preferred. A capping layer is preferably applied prior to diffusion, such as by depositing silicon oxide or silicon nitride. A diffusion step is preferably accomplished by rapid thermal annealing.

DESCRIPTION OF THE PREFERRED EMBODIMENTS

Figure 1:
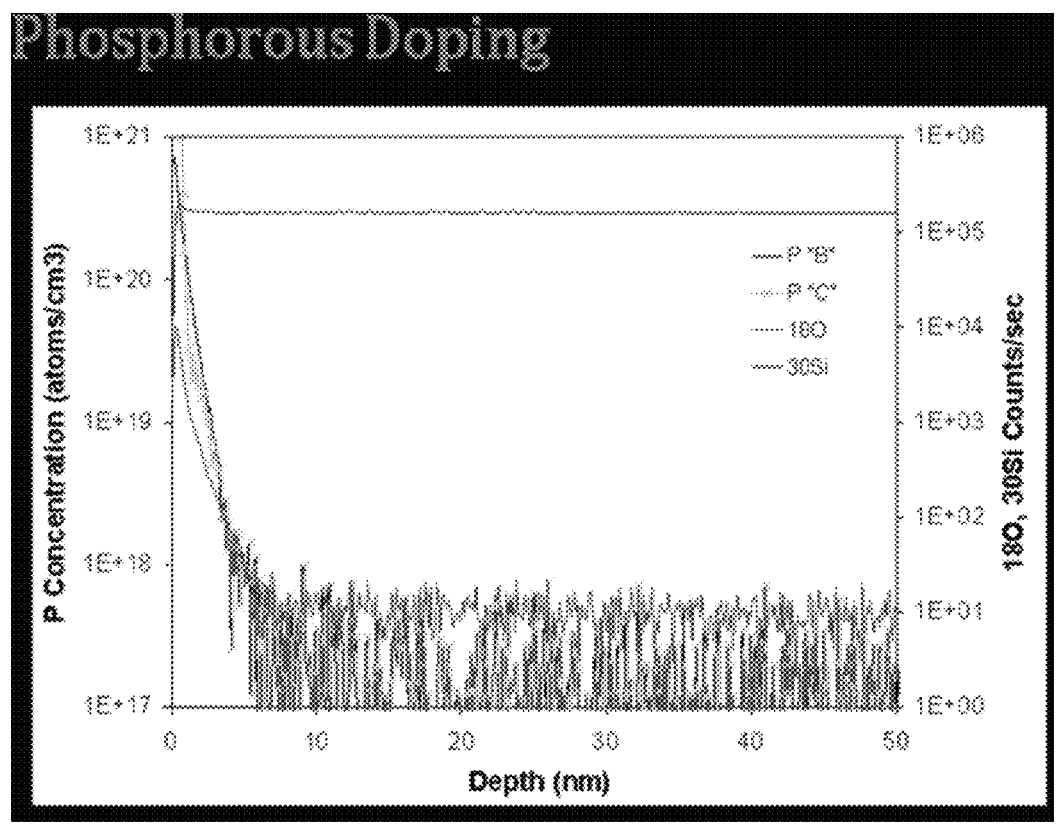
FIG. 1 is a chart showing the penetration depth of phosphorus atoms or boron atoms into the silicon substrate after a capping and high temperature annealing process.

For the purposes of promoting an understanding of the principles of the invention, reference will now be made to certain embodiments and specific language will be used to describe the same. It will nevertheless be understood that no limitation of the scope of the invention is thereby intended, such alterations and further modifications of the illustrated embodiments being contemplated as would normally occur to one skilled in the art to which the invention relates.

In one aspect of the present invention there is provided a method for doping a Si surface by treating the substrate with a diluted dopant solution comprising tetraethylene glycol dimethyl ether (tetraglyme) and a dopant-containing material and subsequently diffusing the dopant into the surface.

In the preferred embodiments the Si surface is initially cleaned to remove oxides and provide an H-terminated silicon surface. The initial cleaning may be accomplished using dilute HF, for example. Additional steps may also be employed to protect the surface until the tetraglyme-dopant treatment, such as treating the surface with 3-methyl-3-methoxybutanol.

In one preferred aspect of the present invention tetraethylene glycol dimethyl ether (tetraglyme) is used as a solvent to provide a dopant-containing material to the cleaned Si substrate. The solvent interacts with the dopant molecules, carrying them to the silicon surface and thereby allows control of the amount of dopant that is applied to the surface.

The tetraglyme is preferably included in an amount appropriate to dilute the dopant material to an amount less than 20% and preferably no more than 4%. If no additional solvents are used the amount of tetraglyme may be 80% or more, and preferably 96% or more. If additional solvents are used the amount of tetraglyme may be correspondingly less.

In another embodiment the solvent system comprises a solvent instead of or in addition to tetraglyme. Preferred additional or alternative solvents have individual flash points above 120° C., or provide a solvent system having a combined flash point above 120° C. Preferred additional or alternative solvents also have a contact angle of 0° when applied to a Si surface, and are miscible with water. In other embodiments the additional or alternative solvent has those characteristics and is a polar solvent.

The secondary solvent that may replace or be used in addition to tetraglyme may include one or more of the following: dimethylsulfoxide (DMSO), dimethylsulfone, N-methylpyrrolidone (NMP), 1 formyl piperidine, other glycol ethers such as triglyme or diglyme, isopar solvent blends such as Isopar M, alkanolamines such as ethanolamine, diethanolamine, triethanolamine, fatty acids such as linoleic acid, oleic acid, palmitoleic acid, and mixtures of fatty acids in such solvents as safflower oil, grape seed oil, poppyseed oil, sunflower oil, hemp oil, corn oil, wheat germ oil, cottonseed oil, soybean oil, walnut oil, sesame oil, rice bran oil, pistachio oil, peanut oil, canola oil, chicken fat, egg yolk, linseed oil, lard, olive oil, palm oil, cocoa butter, macadamia oil, butter, and coconut oil As to the dopant, diethyl-1-propylphosphonate and allylboronic acid pinacol ester are preferred dopant-containing materials. In some embodiments other dopants effective for producing n-doped or p-doped surfaces may be used in addition to or instead of diethyl-1-propylphosphonate and/or allylboronic acid pinacol ester. For example, arsenic or another Group V material may be used in addition to or in place of phosphorus, and galium or another Group III material may be used in addition to or in place of boron.

In other embodiments the dopant comprises 5-5 Dimethyl-1,3,2-dioxaphosphorinan-2-one. In another embodiment the dopant comprises triphenylphosphate. In another embodiment the dopant comprises trimethylphosphite. In another embodiment the dopant comprises diethyl ethylphosphonate. In another embodiment the dopant comprises dimethyl methylphosphonate. In another embodiment the dopant comprises diethyl(2-oxobutyl)phosphonate. In another embodiment the dopant comprises diethyl(hydroxymethyl)phosphonate. In another embodiment the dopant comprises dimethyl(3-phenoxyacetonyl)phosphonate. In another embodiment the dopant comprises bis(4-methoxyphenyl)phosphine. In another embodiment the dopant comprises bis(3,5-dimethylphenyl)phosphine. In another embodiment the dopant comprises diethyl(2-oxopropyl)phosphonate. In another embodiment the dopant comprises diethyl 1-phenylethyl phosphonate. In another embodiment the dopant comprises diethyl 2-phenylethyl phosphonate. In another embodiment the dopant comprises diethyl cyclopropylmethyl phosphonate. In another embodiment the dopant comprises dimethyl (3-phenoxyacetonyl)phosphonate. In another embodiment the dopant comprises diethyl(2-methylallyl)phosphonate. In another embodiment the dopant comprises one or more members selected from the group consisting of 5-5 Dimethyl-1,3,2-dioxaphosphorinan-2-one, triphenylphosphate, trimethylphosphite, diethyl ethylphosphonate, dimethyl methylphosphonate, diethyl(2-oxobutyl)phosphonate, diethyl(hydroxymethyl)phosphonate, dimethyl(3-phenoxyacetonyl)phosphonate, bis(4-methoxyphenyl)phosphine, bis(3,5-dimethylphenyl)phosphine, diethyl (2-oxopropyl)phosphonate, diethyl 1-phenylethyl phosphonate, diethyl 2-phenylethyl phosphonate, diethyl cyclopropylmethyl phosphonate, dimethyl (3-phenoxyacetonyl)phosphonate, diethyl (2-methylallyl)phosphonate, and Diethyl-1-propyl phosphonate.

The dopant material is preferably included in the diluted dopant solution in an amount ranging from about 1% to about 20%, with a dopant amount of 1% to 10% being more preferred, and a doping amount of 4% or less being most preferred in testing to date.

A capping layer is preferably applied prior to diffusion, such as by depositing silicon oxide or silicon nitride. In one embodiment a 50 nm thick capping layer is applied by plasma enhanced chemical vapor deposition (PECVD) prior to diffusion.

The dopant material is diffused into the Si surface by annealing after the deposition of a capping layer. Preferably, rapid thermal annealing (RTA) is used.

Reference will now be made to specific examples using the processes described above. It is to be understood that the examples are provided to more completely describe preferred embodiments, and that no limitation to the scope of the invention is intended thereby.

Example 1

Solubility Testing

A variety of solvents were evaluated as potential replacements for mesitylene in allylboronic acid pinacol ester:mesitylene and diethylpropyl-phosphonate:mesitylene systems. The candidate solvents included: 1) Dimethylsulfoxide (DMSO); 2) N-methylpyrrolidone (NMP); 3) 1-formyl piperidine (1-FP); 4) tetraglyme, (TG); and 5) Isopar M (IM).

Solubility was tested with diethyl 1-propylphoshonate 97% (n-type dopant) and allylboronic acid pinacol ester (p-type dopant). Solvent to additive ratio (n or p type) material is 1:4. Solubility results are provided below:

| Solvent and Diethyl 1-propylphoshonate | Solubility observations after 12 hrs, @ 23° C. |
|---|---|
| DMSO | Clear, stayed in sol'n |
| NMP | Clear, stayed in sol'n |
| 1-FP | Clear, stayed in sol'n |
| TG | Clear, stayed in sol'n |
| IM | Clear, stayed in sol'n |

| Solvent and Allyboronic acid pinacol ester | Solubility observations after 12 hrs, @ 23° C. |
|---|---|
| DMSO | Slightly cloudy, stayed in sol'n |
| NMP | Slightly cloudy, stayed in sol'n |
| 1-FP | Clear, stayed in sol'n |
| TG | Clear, stayed in sol'n |
| IM | Clear, stayed in sol'n |

All of the materials were soluble and stayed in solution. They were checked after 12 hours, having been maintained at room temperature.

Example 2

Contact Angle Testing

Contact angle testing was also conducted. Silicon substrates (n-doped and p-doped prior to testing) were submerged in 0.5% HF(aq) for 2 minutes at room temperature (23° C.) before testing contact angles. DI water and mesitylene were used as references.

The observed contact angles on Si (100) n-type and p-type are reported below:

| Solvent and Diethyl 1-propylphoshonate | Substrate | Contact Angle |
|---|---|---|
| Mesitylene | n-doped Si | No reading = 0 |
| | p-doped Si | No reading = 0 |
| DMSO | n-doped Si | No reading = 0 |
| | p-doped Si | Avg. = 22.57° |
| NMP | n-doped Si | No reading = 0 |
| | p-doped Si | No reading = 0 |
| 1-Formyl Piperidine | n-doped Si | No reading = 0 |
| | p-doped Si | No reading = 0 |
| Tetraglyme | n-doped Si | No reading = 0 |
| | p-doped Si | No reading = 0 |
| Isopar M | n-doped Si | No reading = 0 |
| | p-doped Si | No reading = 0 |

| Solvent and Allylboronic acid pinacol ester | Substrate | Contact Angle |
|---|---|---|
| Mesitylene | n-doped Si | No reading = 0 |
| | p-doped Si | No reading = 0 |
| DMSO | n-doped Si | No reading = 0 |
| | p-doped Si | No reading = 0 |
| NMP | n-doped Si | No reading = 0 |
| | p-doped Si | No reading = 0 |
| 1-FP | n-doped Si | No reading = 0 |
| | p-doped Si | No reading = 0 |
| TG | n-doped Si | No reading = 0 |
| | p-doped Si | No reading = 0 |
| IM | n-doped Si | No reading = 0 |
| | p-doped Si | No reading = 0 |

| | Substrate | Contact Angle |
|---|---|---|
| DI water | n-doped Si | Avg. = 78.89° |
| | p-doped Si | Avg. = 73.52° |

The contact angle testing indicated that all of the tested solvents other than DMSO have no contact angle and therefore wet the surface of the substrate. Given the contact angle measurement for DMSO, it was excluded from further testing.

Example 3

Phosphorus Doping

Diluted dopant solutions were used to dope a Si substrate. The following glassware was used for the doping testing: 3 neck round bottom flask (500 mL), 2 distilling columns, stainless steel tube for $N_2$ inlet, 2 thermometer adaptors, Y distillation adaptor, 4 tubes for columns and $N_2$, circulation bath, thermometer, heating mantel.

The following materials were used: $N_2$ (ultra high purity), Ethylene Glycol/water mixture (1:1), experimental solution (solutions used are listed below), 3-methyoxy-3-methylbutanol, 0.5% HF solution, IPA, n-type Si substrate, p-type Si substrate.

The test procedure was as follows:
1. Set up the glassware, reflux bath (ethylene glycol and DI 1:1), place round bottom flask on heating mantel, cleave Si substrate into small pieces about 1½ cm×1½ cm for testing. Both n- and p-type substrates were processed at the same time.
2. Prepare Solutions:
   HF (0.5% in solution)
   3-methoxy-3-methylbutanol
   Experimental solution:
   Solution #1—TG and diethyl 1-propylphonate 4:1 (v/v)—20 g total in flask
   Solution #2—1-FP and diethyl 1-propylphonate 4:1 (v/v)—20 g total in flask
   Solution #3—TG and allylboronic acid pinacol ester 4:1 (v/v)—20 g total in flask
   Solution #4—1-FP and allylboronic acid pinacol ester 4:1 (v/v)—20 g total in flask
3. Purge the round bottom flask containing the desired solution with $N_2$, bubbling the $N_2$ though the fluid for an hour at room temperature.
4. Heat solution to 120° C. using the heating mantel, start the cooling liquid flow (~10° C.) through the condenser while heating and continue its flow throughout the doping process.
5. Once the solution is at 120° C., prepare substrates by processing them in room temperature solutions of HF (2 min) and then 3-methoxy-3-methylbutanol (30 s).
6. Immediately after step 5, place the treated substrates in a round bottom flask containing heated dilute doping solution for 2.5 h at 120° C., and continue the $N_2$ bubbling.
7. After 2.5 hours, cool the glassware apparatus and solution for 15 to 20 minutes, with the cooling water still running through the condenser before removing the pieces.
8. Rinse pieces in IPA after removing from the solution.
9. Deposit silicon oxide or silicon nitride or other appropriate capping material, such as plasma enhanced tetraethylorthosilicate (PETEOS).
10. Carry out a high temperature anneal process (1050° C. anneal), and characterize by Secondary Ion Mass Spectrometry (SIMS).

SIMS is an analytical technique that detects very low concentrations of dopants and impurities. It can provide elemental depth profiles over a depth range from a few angstroms to tens of microns. SIMS works by sputtering the sample surface with a beam of primary ions. Secondary ions formed during the sputtering are extracted and analyzed using a mass spectrometer. These secondary ions can range from matrix levels down to sub-parts-per-million trace levels. This technique was used to determine if phosphorus atoms (from diethyl 1-propylphosphonate) or boron atoms (from allylboronic acid pinacol ester) penetrated into the silicon substrate after the capping and high temperature annealing processes.

Results are shown in FIG. 1. The x-axis indicates the depth of penetration of each atom type that was monitored (and is indicated on the graph's legend)

In the above example, one sample was created using mesitylene as the solvent, and one was prepared using tetraglyme (TG) as the solvent. The samples were compared using SIMS to generate data for the comparison. The system using tetraglyme as the solvent provided phosphorus to the surface and, after capping and annealing, allowed the phosphorus to penetrate the Si deeper than the phosphorus provided to the silicon surface by the mesitylene solvent system.

Figure 2:
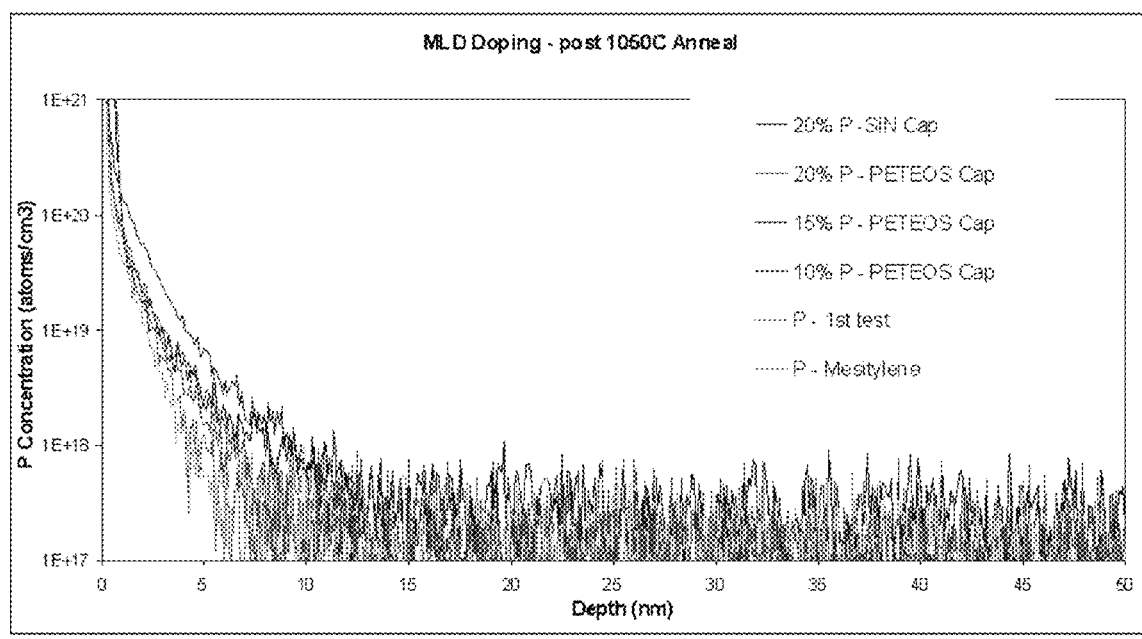
FIG. 2 is a SIMS chart showing the result after multiple loadings of diethyl-1-propylphosphonate in a solvent solution.

Additional SIMS results after multiple loadings of diethyl 1-propylphoshonate in the solution are provided in FIG. 2.

The results for the phosphorus doped samples indicate that doping depth can be controlled by one or a combination of factors such as doping concentration, time, and temperature.

Example 4

Representative Production Process

The doped surfaces of the present invention may be produced by the following process:
1. Clean and dry a patterned Si wafer, preferably using DHF solution;
2. Clean immersion tank;
3. Rinse cleaned tank with tetraglyme or doping solution multiple times until all the solution that was used for cleaning is purged;
4. Fill tank with doping solution to a level great enough to completely cover the wafers to be doped;
5. Heat the doping solution to the temperature required to create a layer of dopant on the silicon;
6. Completely immerse the wafers in the doping solution for time required to create a layer of dopant on the silicon;
7. Rinse wafers with appropriate solvent (for example, IPA or $H_2O$); and
8. Dry the wafers with $N_2$.

Subsequent to the above, the doped surfaces may be treated as follows:
1. Oxide deposition; and
2. Annealing to promote dopant diffusion.

Appropriate process steps for capping the doped surface (oxide deposition) and for annealing to promote dopant diffusion may be accomplished using methods known to persons skilled to the art.

While the compositions and methods of the present invention have been described by reference to certain preferred embodiments, it will be apparent to those of skill in the art that variations may be applied to the compositions and methods described herein without departing from the concept and spirit of the invention. All such modifications apparent to those skilled in the art are desired to be protected, and are deemed to be within the scope of the invention as herein disclosed and claimed.

What is claimed is:

1. A method, comprising:
    contacting a silicon-containing substrate with a dopant solution to form a layer of dopant-containing material on the silicon-containing substrate, the dopant solution including a solvent and a dopant, wherein the dopant solution has a flash point greater than 120° C.
2. The method of claim 1, wherein the dopant includes one or more elements of Group III of the Periodic Table, one or more elements of Group V of the Periodic Table, or a combination thereof.
3. The method of claim 1, wherein the silicon-containing substrate includes crystalline silicon.
4. The method of claim 1, further comprising cleaning the silicon-containing substrate to remove oxides before contacting the silicon-containing substrate with the dopant solution.
5. The method of claim 1, further comprising treating the silicon-containing substrate with 3-methyl-3-methoxybutanol.
6. The method of claim 1, further comprising applying a capping layer to the silicon-containing substrate after contacting the silicon-containing substrate with the dopant solution.
7. The method of claim 6, wherein the capping layer has a thickness of about 50 nm.
8. The method of claim 6, wherein the capping layer is applied by plasma enhanced chemical vapor deposition.
9. The method of claim 1, further comprising annealing the silicon-containing substrate to diffuse the dopant into the silicon-containing substrate.
10. The method of claim 1, wherein dopant solution comprises one or more than one solvent, and each individual solvent present has a flash point of 120C or more.
11. A method, comprising:
    contacting a surface including crystalline silicon with a dopant solution to form a layer of dopant-containing material on the surface, the dopant solution including a solvent and a dopant, wherein the solvent comprises tetraethylene glycol dimethyl ether, triethylene glycol dimethyl ether, diethylene glycol dimethyl ether, dimethylsulfoxide, dimethylsulfone, N-methylpyrrolidone, 1-formyl piperidine, Isopar M, ethanolamine, diethanolamine, triethanolamine, linoleic acid, oleic acid, palmitoleic acid, safflower oil, grape seed oil, poppyseed oil, sunflower oil, hemp oil, corn oil, wheat germ oil, cottonseed oil, soybean oil, walnut oil, sesame oil, rice bran oil, pistachio oil, peanut oil, canola oil, chicken fat, egg yolk, linseed oil, lard, olive oil, palm oil, cocoa butter, macadamia oil, butter, coconut oil, or combinations thereof.
12. The method of claim 11, wherein an amount of the dopant in the dopant solution is included in a range of 1 wt % to 20 wt % of a total weight of the dopant solution.
13. The method of claim 11, wherein the dopant solution includes less than 4 wt % of the dopant for a total weight of the dopant solution.
14. The method of claim 11, wherein the dopant solution has a contact angle of 0° when applied to the surface.
15. The method of claim 11, wherein the dopant includes arsenic, gallium, boron, phosphorus, or a combination thereof.
16. The method of claim 11 wherein dopant solution comprises one or more than one solvent, and each individual solvent present has a flash point of 120C or more.
17. A method comprising:
    contacting a silicon-containing surface with a dopant solution to form a layer of dopant-containing material on the silicon-containing surface, the dopant solution including a solvent and arsenic-containing molecules, wherein said solvent comprises tetraethylene glycol dimethyl ether, triethylene glycol dimethyl ether, diethylene glycol dimethyl ether, dimethylsulfoxide, dimethylsulfone, N-methylpyrrolidone, 1-formyl piperidine, Isopar M, ethanolamine, diethanolamine, triethanolamine, linoleic acid, oleic acid, palmitoleic acid, safflower oil, grape seed oil, poppyseed oil, sunflower oil, hemp oil, corn oil, wheat germ oil, cottonseed oil, soybean oil, walnut oil, sesame oil, rice bran oil, pistachio oil, peanut oil, canola oil, chicken fat, egg yolk, linseed oil, lard, olive oil, palm oil, cocoa butter, macadamia oil, butter, coconut oil, or combinations thereof.

18. The method of claim 17, wherein the solvent is one of a plurality of solvents of the dopant solution.

19. The method of claim 17, wherein a flash point of the dopant solution is greater than 120° C.

20. The method of claim 17, wherein the dopant solution is miscible in water.

21. The method of claim 17, wherein the contacting the silicon-containing surface with the dopant solution includes immersing a silicon substrate containing crystalline silicon in the dopant solution.

22. The method of claim 17 wherein dopant solution comprises one or more than one solvent, and each individual solvent present has a flash point of 120C or more.

* * * * *